(12) United States Patent
Tsai et al.

(10) Patent No.: US 9,941,394 B2
(45) Date of Patent: Apr. 10, 2018

(54) TUNNEL FIELD-EFFECT TRANSISTOR

(71) Applicant: TAIWAN SEMICONDUCTOR MANUFACTURING CO., LTD., Hsinchu (TW)

(72) Inventors: Teng-Chun Tsai, Hsinchu (TW); Cheng-Tung Lin, Jhudong Township (TW); Li-Ting Wang, Hsinchu (TW); Chih-Tang Peng, Zhubei (TW); De-Fang Chen, Hsinchu (TW); Hung-Ta Lin, Hsinchu (TW); Chien-Hsun Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/460,214

(22) Filed: Aug. 14, 2014

(65) Prior Publication Data

US 2015/0318214 A1 Nov. 5, 2015

Related U.S. Application Data

(60) Provisional application No. 61/986,641, filed on Apr. 30, 2014.

(51) Int. Cl.
*H01L 29/06* (2006.01)
*H01L 29/739* (2006.01)
(Continued)

(52) U.S. Cl.
CPC .......... *H01L 29/7391* (2013.01); *B82Y 10/00* (2013.01); *H01L 21/265* (2013.01);
(Continued)

(58) Field of Classification Search
CPC ..... H01L 21/823462; H01L 21/823468; H01L 21/823487; H01L 21/823493;
(Continued)

(56) References Cited

U.S. PATENT DOCUMENTS

| 4,978,873 A | * | 12/1990 | Shoemaker | ............ | G06G 7/163 |
| | | | | | 257/E27.062 |
| 6,023,427 A | * | 2/2000 | Lakhani | ................. | G11C 5/145 |
| | | | | | 365/185.33 |

(Continued)

FOREIGN PATENT DOCUMENTS

CN 102832221 A 12/2012
KR 10-2009-0007393 A 1/2009
(Continued)

OTHER PUBLICATIONS

Maintaining the benefits of CMOS scaling when scaling bogs down (E.J. Nowak, IBM J. Res. & Dev. vol. 46 No. 2/3 Mar./May 2002).
(Continued)

*Primary Examiner* — Jesse Y Miyoshi
*Assistant Examiner* — Tuan A Hoang
(74) *Attorney, Agent, or Firm* — Maschoff Brennan

(57) ABSTRACT

The tunnel field-effect transistor includes a drain layer, a source layer, a channel layer, a metal gate layer, and a high-k dielectric layer. The drain and source layers are of opposite conductive types. The channel layer is disposed between the drain layer and the source layer. At least one of the drain layer, the channel layer, and the source layer has a substantially constant doping concentration. The metal gate layer is disposed around the channel layer. The high-k dielectric layer is disposed between the metal gate layer and the channel layer.

20 Claims, 11 Drawing Sheets

(51) Int. Cl.

| | |
|---|---|
| *H01L 21/8234* | (2006.01) |
| *H01L 29/78* | (2006.01) |
| *H01L 27/088* | (2006.01) |
| *H01L 29/66* | (2006.01) |
| *H01L 29/10* | (2006.01) |
| *H01L 29/08* | (2006.01) |
| *H01L 21/265* | (2006.01) |
| *H01L 29/51* | (2006.01) |
| *B82Y 10/00* | (2011.01) |
| *H01L 29/423* | (2006.01) |
| *H01L 29/775* | (2006.01) |
| *H01L 29/16* | (2006.01) |

(52) U.S. Cl.
CPC ........ *H01L 21/823462* (2013.01); *H01L 21/823468* (2013.01); *H01L 21/823487* (2013.01); *H01L 21/823493* (2013.01); *H01L 27/088* (2013.01); *H01L 29/068* (2013.01); *H01L 29/0649* (2013.01); *H01L 29/0653* (2013.01); *H01L 29/0657* (2013.01); *H01L 29/0676* (2013.01); *H01L 29/0847* (2013.01); *H01L 29/1041* (2013.01); *H01L 29/42376* (2013.01); *H01L 29/517* (2013.01); *H01L 29/518* (2013.01); *H01L 29/665* (2013.01); *H01L 29/66068* (2013.01); *H01L 29/66356* (2013.01); *H01L 29/66439* (2013.01); *H01L 29/66469* (2013.01); *H01L 29/66553* (2013.01); *H01L 29/66666* (2013.01); *H01L 29/66977* (2013.01); *H01L 29/775* (2013.01); *H01L 29/7827* (2013.01); *H01L 29/105* (2013.01); *H01L 29/1608* (2013.01)

(58) Field of Classification Search
CPC ............ H01L 29/0649; H01L 29/0657; H01L 29/66553; H01L 29/66666; H01L 29/7827
See application file for complete search history.

(56) References Cited

U.S. PATENT DOCUMENTS

| | | | | |
|---|---|---|---|---|
| 6,294,418 | B1* | 9/2001 | Noble | H01L 21/823885 257/E21.429 |
| 7,893,476 | B2* | 2/2011 | Verhulst | B82Y 10/00 257/296 |
| 8,415,209 | B2* | 4/2013 | Rooyackers | B82Y 10/00 438/149 |
| 2010/0207201 | A1* | 8/2010 | Masuoka | H01L 27/0207 257/329 |
| 2011/0253981 | A1 | 10/2011 | Rooyackers et al. | |
| 2012/0119279 | A1 | 5/2012 | Forbes | |
| 2012/0217468 | A1* | 8/2012 | Tekleab | B82Y 10/00 257/9 |
| 2012/0319201 | A1* | 12/2012 | Sun | H01L 21/823487 257/338 |
| 2013/0093000 | A1* | 4/2013 | Guo | H01L 29/4983 257/329 |
| 2013/0175587 | A1* | 7/2013 | Ramachandran | H01L 21/76895 257/288 |
| 2013/0306621 | A1 | 11/2013 | Chang et al. | |
| 2013/0307066 | A1* | 11/2013 | Hsieh | H01L 29/7827 257/331 |
| 2014/0061775 | A1 | 3/2014 | Chuang et al. | |
| 2014/0203352 | A1* | 7/2014 | Chuang | H01L 29/66356 257/329 |
| 2014/0299923 | A1* | 10/2014 | Chang | H01L 21/26533 257/288 |
| 2014/0306273 | A1* | 10/2014 | Ho | H01L 21/28088 257/288 |
| 2015/0069458 | A1* | 3/2015 | Li | H01L 29/66795 257/105 |
| 2015/0090959 | A1* | 4/2015 | Moselund | B82Y 10/00 257/29 |
| 2015/0236139 | A1* | 8/2015 | Huang | H01L 29/66977 257/9 |

FOREIGN PATENT DOCUMENTS

| | | | |
|---|---|---|---|
| KR | 20120139067 A | | 12/2012 |
| KR | 20140030019 A | | 3/2014 |
| WO | WO 2013101172 a1 | * | 7/2013 |

OTHER PUBLICATIONS

TFET—a possible replacement for CMOS in low-power applications (C. Anghel et al., Paris, Aug. 4, 2011).
CMOS—Compatible Vertical-Silicon-Nanowire Gate-All-Around p-Type Tunneling FETs With <50-mV/decade Subthreshold Swing (Ramanathan Gandhi et al., IEEE Electron Device Letters, vol. 32, No. 11, Nov. 2011).
Impact of process and geometrical parameters on the electrical characteristics of vertical nanowire silicon n-TFETs (A. Vandooren et al., Solid-State Electronics 72 (2012) 82-87 ).
Band-to-Band Tunneling in Carbon Nanotube Field-Effect Transistors(J. Appenzeller et al, Physical Review Letters, vol. 93, No. 19, 2004).
Tunneling Field-Effect Transistors (TFETs) With Subthreshold Swing (SS) Less Than 60 mV/dec (Woo Young Choi et al, IEEE Electron Device Letters, vol. 28, No. 8, Aug. 2007 ).
Impact of SOI, Si1—xGexOI and GeOI substrates on CMOS compatible Tunnel FET performance (F. Mayer et al, 2008 IEEE).
Double-Gate Strained-Ge Heterostructure Tunneling FET (TFET) With Record High Drive Currents and < 60mV/dec Subthreshold Slope (Tejas Krishnamohan et al, 2008 IEEE).
Demonstration of Tunneling FETs Based on Highly Scalable Vertical Silicon Nanowires (Z. X. Chen et al, IEEE Electron Device Letters, vol. 30, No. 7, Jul. 2009).
Effect of Pocket Doping and Annealing Schemes on the Source-Pocket Tunnel Field-Effect Transistor (Ritesh Jhaveri et al, IEEE Transactions on Electron Devices, vol. 58, No. 1, Jan. 2011).
Si Tunnel Transistors with a Novel Silicided Source and 46m/Vdec Swing (Kanghoon Jeon et al, 2010 IEEE).
Complementary Silicon-Based Heterostructure Tunnel-FETs With High Tunnel Rates (Anne S. Verhulst et al, IEEE Electron Device Letters, 2008).
Lateral Strain Profile as Key Technology Booster for All-Silicon Tunnel FETs (Kathy Boucart et al, IEEE Electron Device Letters, vol. 30, No. 6, Jun. 2009).
Fringing-Induced Drain Current Improvement in the Tunnel Field-Effect Transistor With High-κ GateDielectrics (Martin Schlosser, et al, IEEE Transactions on Electron Devices, vol. 56, No. 1, Jan. 2009).
Tunnel field effect transistor with increased ON current, low-k spacer and high-k dielectric (Costin Anghel, et al, Applied Physics Letters 96, 122104, 2010).
30-nm Tunnel FET With Improved Performance and Reduced Ambipolar Current (Costin Anghel, et al, IEEE Transactions on Electron Devices, vol. 58, No. 6, Jun. 2011).
Pending U.S. Appl. No. 14/251,933, filed Apr. 14, 2014.
Bijesh et al., "Demonstration of In0.9Ga0.1As/GaAs0.18Sb0.82 Near Broken-gap Tunnel FET with ION=740 μA/ μm, GM=700 μS/μm and Gigahertz Switching Performance at VDS=0.5V," Electron Devices Meeting (IEDM), 2013 IEEE International, p. 28.2.1-28.2.4.

* cited by examiner

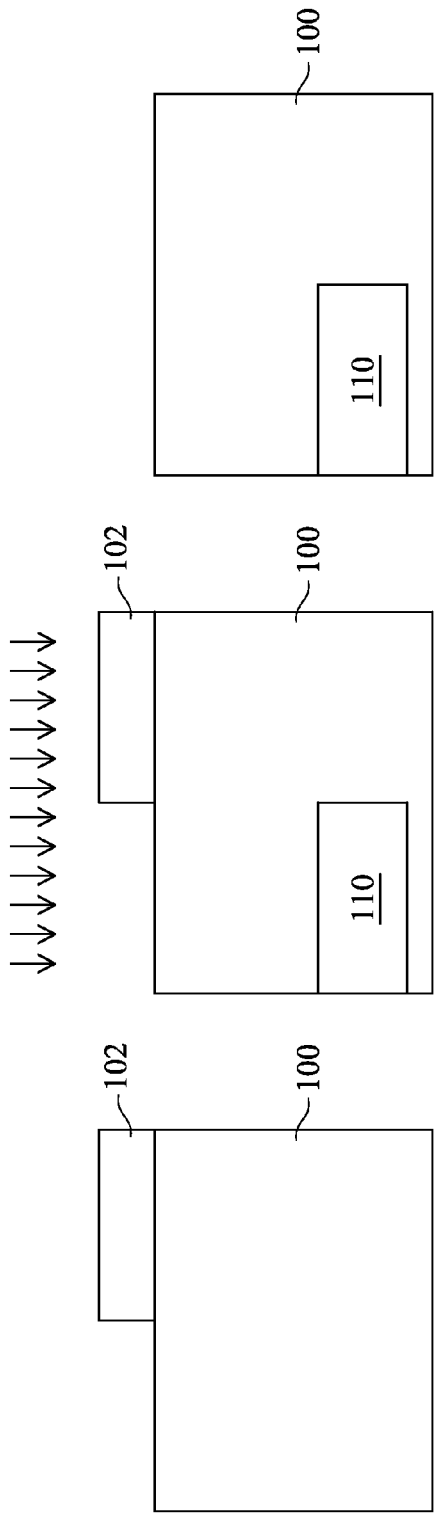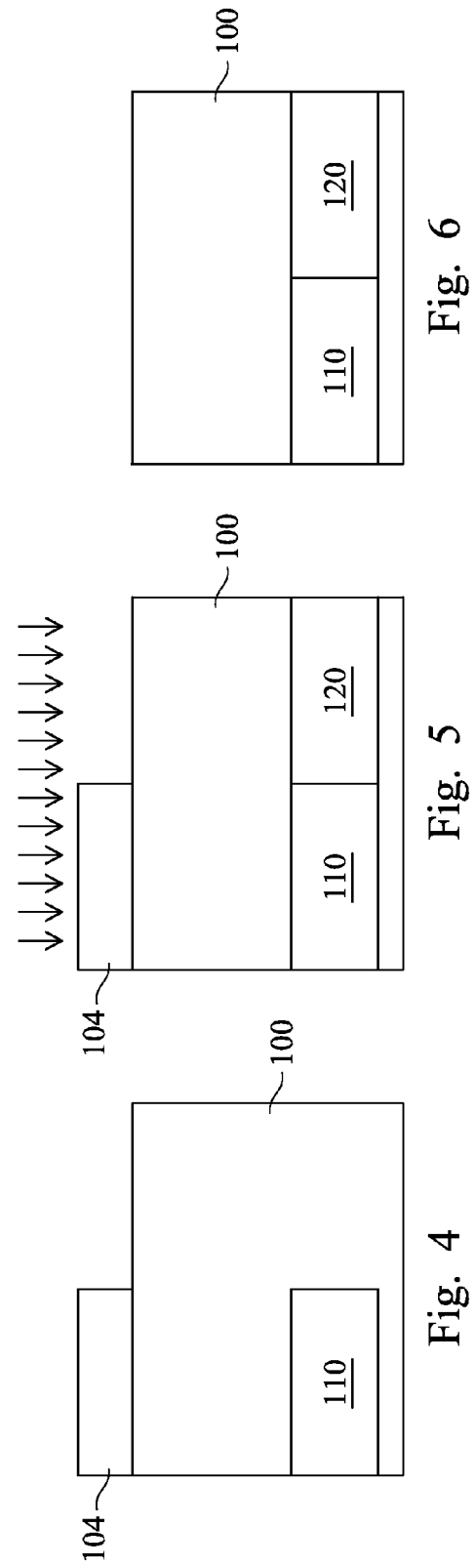

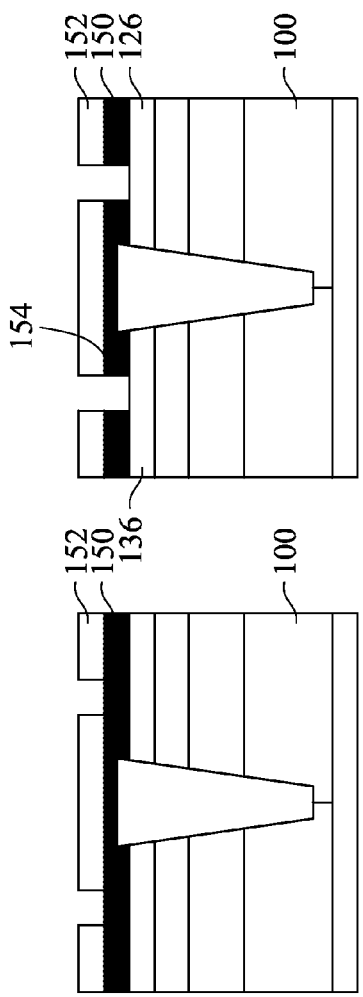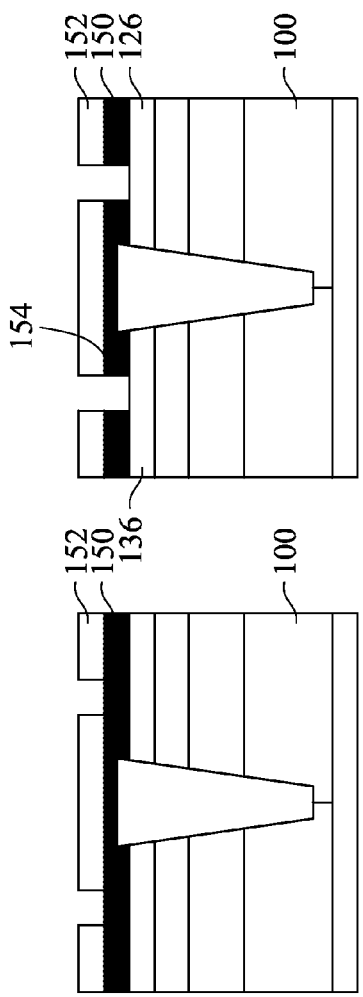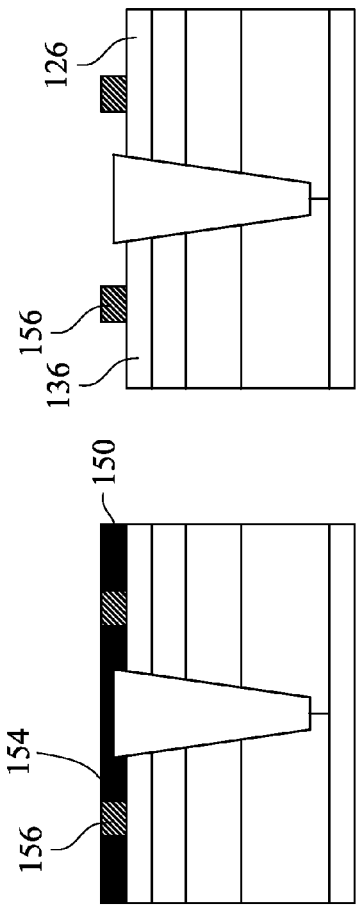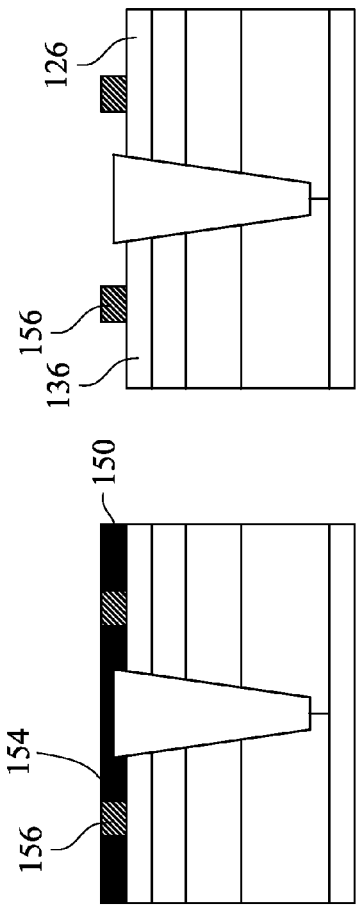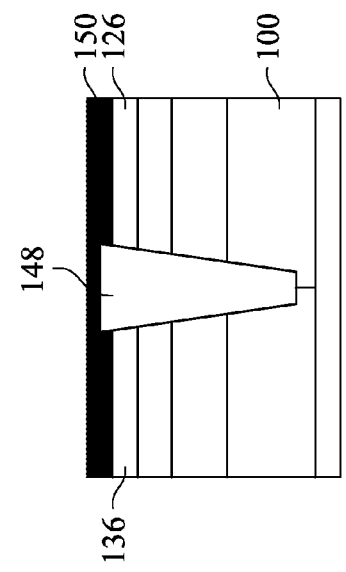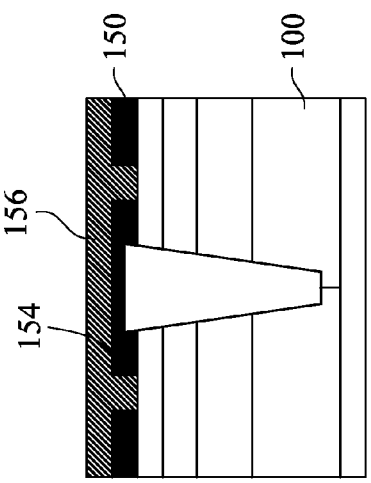

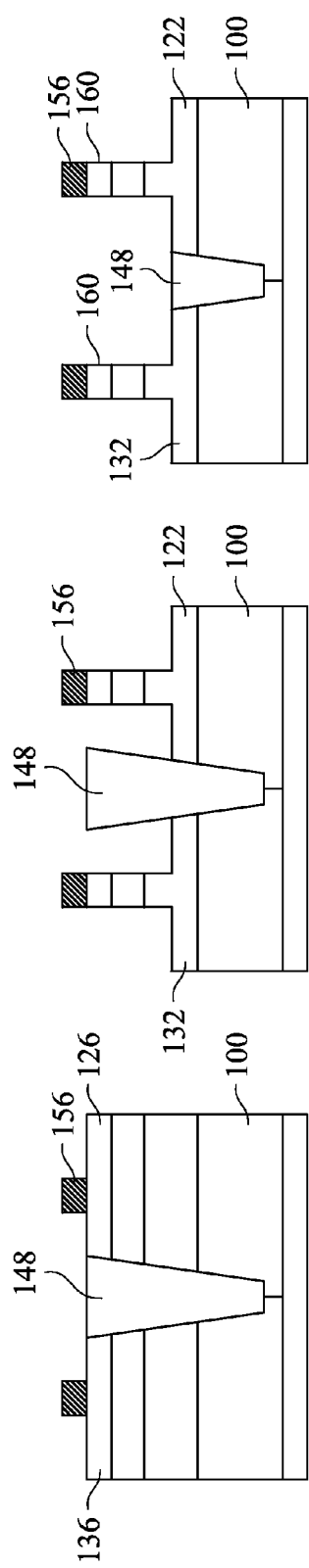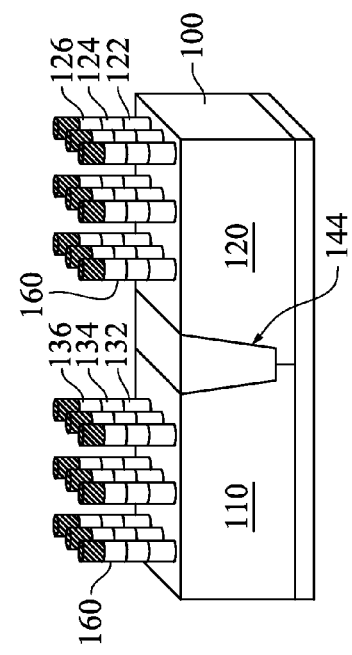

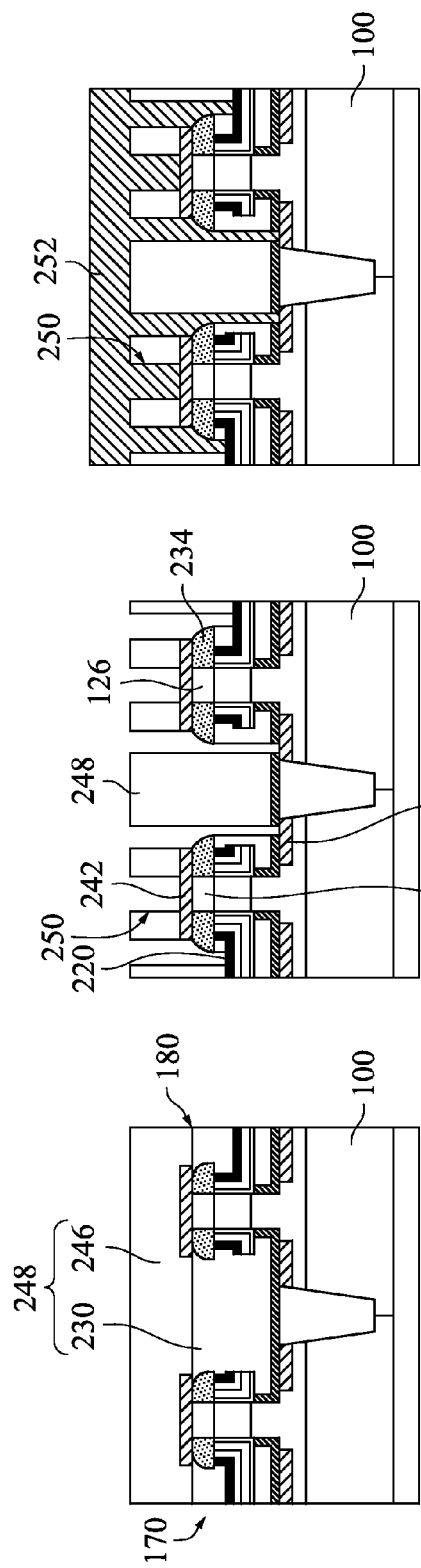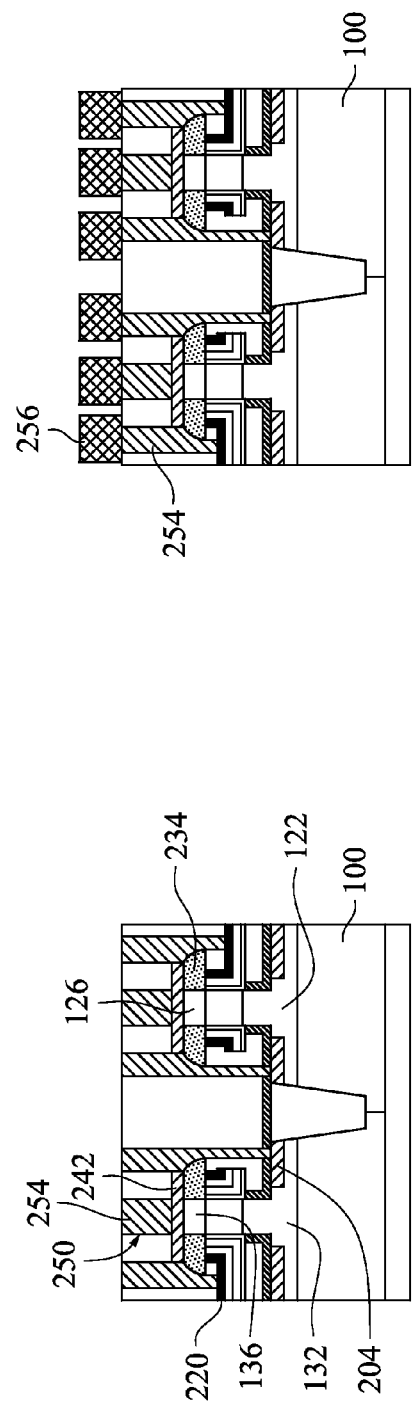

TUNNEL FIELD-EFFECT TRANSISTOR

RELATED APPLICATIONS

This application claims priority to U.S. Provisional Application Ser. No. 61/986,641, filed Apr. 30, 2014, which is herein incorporated by reference.

BACKGROUND

Metal-Oxide-Semiconductor (MOS) technology has been used widely. A MOS device can work in three regions including a linear region, a saturation region, and a sub-threshold region, depending on the gate voltage Vg and the source-drain voltage Vds. The sub-threshold region is a region where voltage Vg is smaller than the threshold voltage Vt. A parameter known as sub-threshold swing (SS) represents the easiness of switching the transistor current off, and is a factor in determining the speed of a MOS device. The sub-threshold swing can be expressed as a function of m*kT/q, where m is a parameter related to capacitance, k is the Boltzman constant, T is the absolute temperature, and q is the magnitude of the electrical charge on an electron. Previous studies have revealed that the sub-threshold swing of a typical MOS device has a limit of about 60 mV/decade at room temperature, which in turn sets a limit for further scaling of operational voltage VDD and threshold voltage Vt. This limitation is due to the diffusion transport mechanism of carriers. For this reason, existing MOS devices typically cannot switch faster than 60 mV/decade at room temperatures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 to FIG. 58 are cross-sectional views of different steps of a method for fabricating a tunnel field-effect transistor component, in accordance with some embodiments.

DETAILED DESCRIPTION

Figure 9:
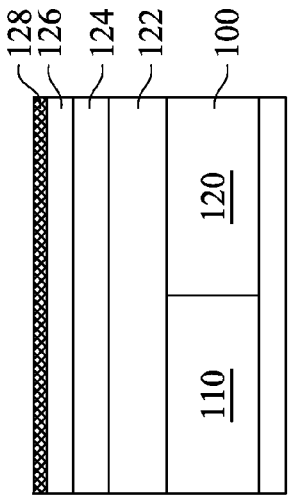

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A tunnel field-effect transistor component having one or more tunnel field-effect transistors and fabricating method thereof are provided in the following description, in which the tunnel field-effect transistor includes a high-k metal gate. The tunnel field-effect transistor provides better immunity to short channel effects.

With reference to FIG. 1 to FIG. 58, which are cross-sectional views of different steps of a method for fabricating a tunnel field-effect transistor component in accordance with some embodiments, in portion or entirety, during various fabrication steps of the method. It is understood that additional steps can be provided before, during, and after the method, and some of the steps described below can be replaced or eliminated, for additional embodiments of the method. It is further understood that additional features can be added in the tunnel field-effect transistor component, and some of the features described below can be replaced or eliminated, for additional embodiments of the tunnel field-effect transistor component.

Referring to FIG. 1, a mask layer 102 is formed on a substrate 100. The substrate 100 is a semiconductor substrate. The substrate 100 can be made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The mask layer 102 is a photoresist layer. The mask layer 102 is patterned by a lithography process to form a plurality of features and a plurality of openings defined by the features on the substrate 100. The pattern of the mask layer 102 is formed according to a predetermined integrated circuit pattern. The lithography process may include photoresist coating, exposing, post-exposure baking, and developing.

Referring to FIG. 2, a portion of the substrate 100 exposed by the mask layer 102 is doped with P-type dopants or N-type dopants to form a P-well or an N-well. In some embodiments, the portion of the substrate 100 is doped with N-type dopants, such as P, As, Si, Ge, C, O, S, Se, Te, or Sb, to form an N-well 110 in the substrate 100. The N-type dopants are doped into the substrate 100 by, for example, ion implantation. The energy of the ions, as well as the ion species and the composition of the substrate 100 using in the ion implantation determine the depth of penetration of the ions in the substrate 100. The mask layer 102 is removed after this step as shown in FIG. 3.

Referring to FIG. 4, a mask layer 104 is formed on the substrate 100, and the mask layer 104 is patterned by a lithography process to form features and openings defined by the features on the substrate 100. The patterned mask layer 104 covers the N-well 110, while a portion of the substrate 100 which is not doped with N-type dopants is exposed by the mask layer 104.

Referring to FIG. 5, the portion of the substrate 100 exposed by the mask layer 104 is doped with P-type dopants or N-type dopants to form a P-well or an N-well. In some embodiments, the portion of the substrate 100 is doped with P-type dopants, such as B, $BF_2$, Si, Ge, C, ZN, Cd, Be, Mg, or In, to form a P-well 120 next to the N-well 110. The P-type dopants are doped into the substrate 100 by, for example, ion implantation. The energy of the ions, as well as the ion species and the composition of the substrate 100 using in the ion implantation determine the depth of penetration of the ions in the substrate 100. The mask layer 104 is removed after this step as shown in FIG. 6.

Referring to FIG. 6, the substrate 100 having the N-well 110 and the P-well 120 is provided. The N-well 110 and the P-well 120 are optionally annealed. The annealing process includes rapid thermal annealing (RTA), laser annealing processes, or other suitable annealing processes.

Figure 7:
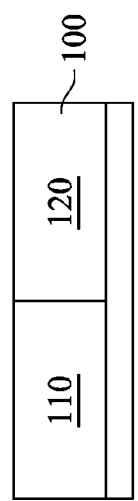

Referring to FIG. 7, the substrate 100 is etched or polished until the N-well 110 and the P-well 120 are exposed.

Figure 8:
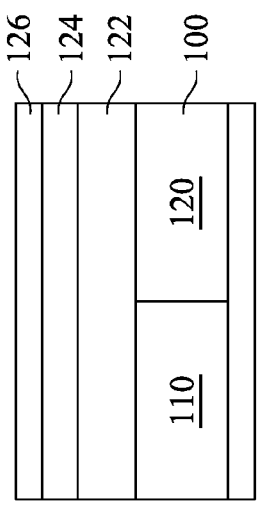

Referring to FIG. 8, a plurality of epitaxial layers 122, 124, and 126 are sequentially formed on the substrate 100. In some embodiments, the epitaxial layers 122, 124, and 126 are sequentially formed on the substrate 100 by epitaxy. One or more polishing processes can be optionally performed when or after the epitaxial layers 122, 124, and 126 are formed. The epitaxial layers 122, 124, and 126 can be formed by, for example, atmospheric chemical vapor deposition (CVD). The epitaxial layers 122, 124, and 126 from bottom to top include an N-type drain layer 122, an N-type channel layer 124, and a P-type source layer 126. In some embodiments, the N-type drain layer 122 and the N-type channel layer 124 can be made of, for example, Si, SiP, SiPC, Ge, or III-V compound, such as InP, GaAs, AlAs, InAs, InAlAs, or InGaAs. The P-type source layer 126 can be made of, for example, Si, SiGe, SiGeB, Ge, or III-V compound, such as InSb, GaSb, InGaSb.

Since at least one of the N-type drain layer 122, the N-type channel layer 124, and the P-type source layer 126 are formed by epitaxy, at least one of the N-type drain layer 122, the N-type channel layer 124, and the P-type source layer 126 has a substantially constant doping concentration. The doping concentration of the P-type source layer 126 is greater than the doping concentration of the N-type drain layer 122, such that the current can go through the N-type channel layer 124 more easily. The doping concentration of the N-type drain layer 122 and/or the P-type source layer 126 is in a range from about $1*10^{18}$ atoms/cm$^3$ to about $1*10^{22}$ atoms/cm$^3$. The doping concentration of the N-type channel layer 124 is in a ranged from about $1*10^{12}$ atoms/cm$^3$ to about $1*10^{18}$ atoms/cm$^3$.

Referring to FIG. 9, a hard mask layer 128 is formed on the P-type source layer 126. The hard mask layer 128 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide (SiO2).

Figure 10:
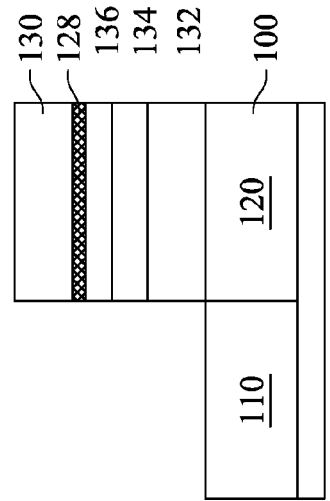

Referring to FIG. 10, a mask layer 130 is formed on the hard mask layer 128 and is patterned by a lithography process to form features and openings defined by the features on the hard mask layer 128. The patterned mask layer 130 covers the P-well 120, and portions of the N-type drain layer 122, the N-type channel layer 124, the P-type source layer 126, and the hard mask layer 128 are exposed by the patterned mask layer 130. The portions of the N-type drain layer 122, the N-type channel layer 124, the P-type source layer 126, and the hard mask layer 128 exposed by the mask layer 130 are removed by, for example, a dry etching process, and thus the N-well 110 is exposed. The mask layer 130 is removed after this step.

Figure 11:
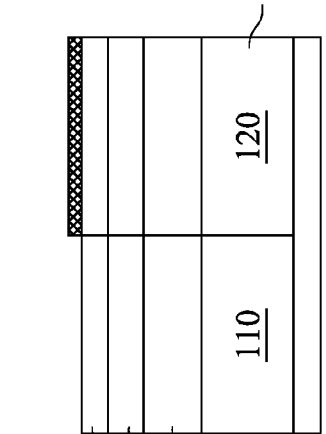

Referring to FIG. 11, a plurality of epitaxial layers 132, 134, and 136 are formed on the N-well 110. In some embodiments, the epitaxial layers 132, 134, and 136 are sequentially formed on the substrate 100 by epitaxy. One or more polishing processes can be optionally performed when or after the epitaxial layers 132, 134, and 136 are formed. The epitaxial layers 132, 134, and 136 can be formed by, for example, atmospheric chemical vapor deposition (CVD). The epitaxial layers 132, 134, and 136 from bottom to top include a P-type drain layer 132, a P-type channel layer 134, and an N-type source layer 136. In some embodiments, the P-type drain layer 132 and the P-type channel layer 134 can be made of, for example, Si, SiGe, SiGeB, Ge, or III-V compound, such as InSb, GaSb, InGaSb. The N-type source layer 136 can be made of, for example, Si, SiP, SiPC, Ge, or III-V compound, such as InP, GaAs, AlAs, InAs, InAlAs, or InGaAs.

Figure 12:
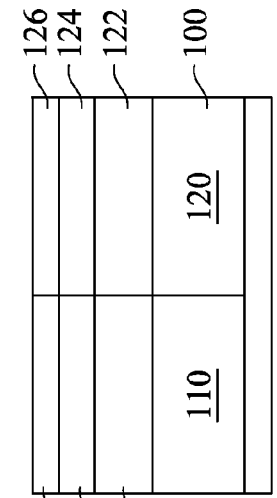

Since at least one of the P-type drain layer 132, the P-type channel layer 134, and the N-type source layer 136 is formed by epitaxy, at least one of the P-type drain layer 132, the P-type channel layer 134, and the N-type source layer 136 has a substantially constant doping concentration. The doping concentration of the P-type drain layer 132 and/or the N-type source layer 136 is in a range from about $1*10^{18}$ atoms/cm$^3$ to about $1*10^{22}$ atoms/cm$^3$. The doping concentration of the P-type channel layer 134 is in a ranged from about $1*10^{12}$ atoms/cm$^3$ to about $1*10^{18}$ atoms/cm$^3$. The doping concentration of the N-type source layer 136 is greater than the doping concentration of the P-type drain layer 132, such that the current can go through the P-type channel layer 134 more easily. The hard mask layer 128 is removed after this step as shown in FIG. 12.

Figure 13:
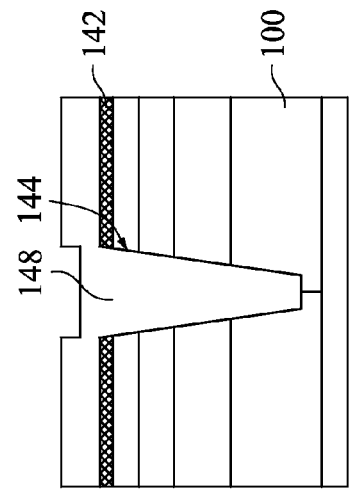

Referring to FIG. 13, a hard mask layer 142 is formed on the surface of the substrate 100.

Figure 14:
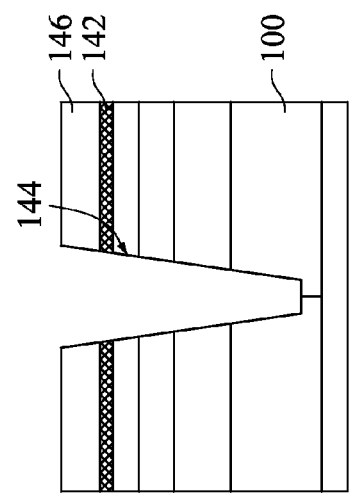

Referring to FIG. 14, a trench 144 is formed in the substrate 100. In order to form the trench 144, a mask layer 146 is formed on the substrate 100. The mask layer 146 is a photoresist layer. The mask layer 146 is patterned by a lithography process to form a plurality of features and a plurality of openings defined by the features on the hard mask layer 142. Then, an etching process is performed to form the trench 144. The etching process is a dry etching process having a selectivity of nitride or oxynitride to oxide of about 1:10 at the openings and about 1:3-4 at the trench bottom. The mask layer 146 is removed after this step.

Figure 15:
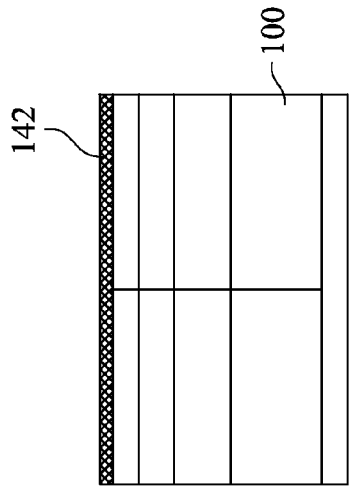

Referring to FIG. 15, a shallow trench isolation (STI) dielectric 148 is filled in the trench 144. The STI dielectric 148 is made of, for example, oxide. A portion of the STI dielectric 148 is deposited on the hard mask layer 142.

Figure 16:
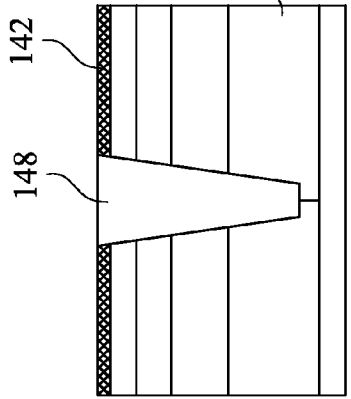

Referring to FIG. 16, the STI dielectric 148 is polished by, for example, chemical mechanical polishing (CMP) with a polish stop at the hard mask layer 142. The hard mask layer 142 is removed after this step.

Figure 17:
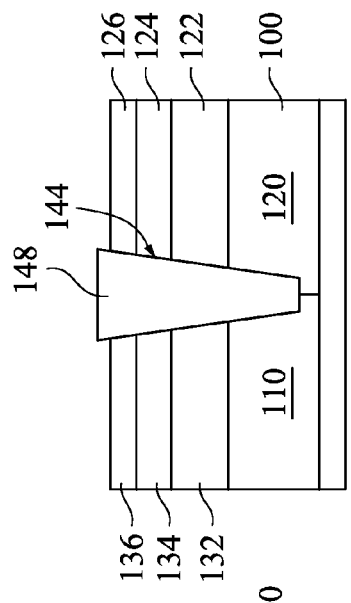

Referring to FIG. 17, a top portion of the STI dielectric 148 protrudes from the surfaces of the P-type source layer 126 and the N-type source layer 136 after the hard mask layer is removed. The N-well 110, the P-type drain layer 132, the P-type channel layer 134, and the N-type source layer 136 are disposed at a side of the trench 144. The P-well 120, the N-type drain layer 122, the N-type channel layer 124, and the P-type source layer 126 are disposed at another side of the trench 144.

Referring to FIG. 18, a first hard mask layer 150 is formed on the substrate 100. The first hard mask layer 150 covers the STI dielectric 148, the P-type source layer 126, and the N-type source layer 136. The first hard mask layer 150 can be formed by a deposition process. The first hard mask 150 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide (SiO2).

Referring to FIG. 19, a mask layer 152 is formed on the first hard mask layer 150 and is patterned by a lithography process to form features and openings defined by the features on the first hard mask layer 150.

Referring to FIG. 20, a portion of the first hard mask layer 150 exposed from the mask layer 152 is dry etched to form a plurality of openings 154 therein. The dry etching process is stopped until it reaches the P-type source layer 126 and the N-type source layer 136. The mask layer 152 is removed after this step.

Referring to FIG. 21, a second hard mask layer 156 is formed on the substrate 100. In some embodiments, a dielectric material is deposited on the first hard mask layer 150 and fills the openings 154 to form the second hard mask layer 156. The second hard mask layer 156 and the first hard mask layer 150 are made of different materials. The second hard mask layer 156 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide (SiO2).

Referring to FIG. 22, the second hard mask layer 156 is polished. The polishing process is stopped at the first hard mask layer 150. Therefore, the second hard mask layer 156 becomes a plurality of blocks inserted in the openings 154 in the first hard mask layer 150. Then, the first hard mask layer 150 is removed. Since the first hard mask layer 150 and the second hard mask layer 156 are made of different materials, a wet etching process using high-selectivity solution between the first hard mask layer 150 and the second hard mask layer 156 is utilized for removing the first hard mask layer 150. Alternatively, in some embodiments, the first hard mask layer 150 can be removed by a dry etching process as well. After the first hard mask layer 150 is removed, the patterned second hard mask layer 156 is formed on the P-type source layer 126 and the N-type source layer 136 as shown in FIG. 23.

Referring to FIG. 24, the top portion of the STI dielectric 148 protruding from the P-type source layer 126 and the N-type source layer 136 is removed by, for example, a dry etching process. The dry etching process is stopped until it reaches the top surfaces of the P-type source layer 126 and the N-type source layer 136.

Referring to FIG. 25, portions of the N-type drain layer 122, the N-type channel layer 124, the P-type source layer 126, the P-type drain layer 132, the P-type channel layer 134, and the N-type source layer 136 exposed by the second hard mask layer 156 is removed by, for example, a dry etching process. The dry etching process is stopped at a predetermined depth. For example, the dry etching process is stopped at a position between the top surfaces and the bottom surfaces of the N-type drain layer 122 and the P-type drain layer 132. In some embodiments, the dry etching process is stopped at the middles of the N-type drain layer 122 and the P-type drain layer 132.

Referring to FIG. 26, a top portion of the STI dielectric 148 protruding from the N-type drain layer 122 and the P-type drain layer 132 is removed by, for example, a dry etching process. Therefore, a plurality of semiconductor wire structures 160 are formed on the substrate 100. The substrate 100 is optionally annealed. In the annealing process, a high temperature gas, such as hydrogen, is provided into the process chamber where the substrate 100 is annealed. In some embodiments, the semiconductor wire structures 160 are oxidized, and the oxide thereof is removed by stripping to thin the semiconductor wire structures 160.

An oblique view of the substrate 100 after the annealing process is shown in FIG. 27, in which the semiconductor wire structures 160 are substantially vertically formed on the substrate 100. The N-well 110 and the P-well 120 are isolated by the trench 144.

Figure 28:
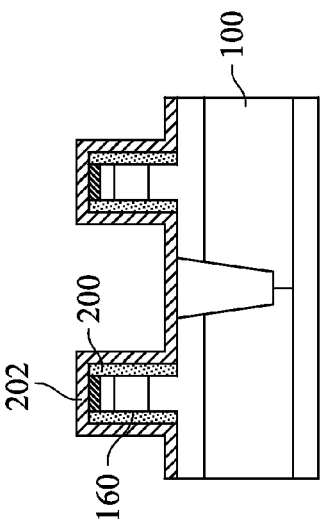

Referring to FIG. 28, a spacer layer 200 is formed on the substrate 100. The spacer layer 200 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide (SiO$_2$).

Figure 29:
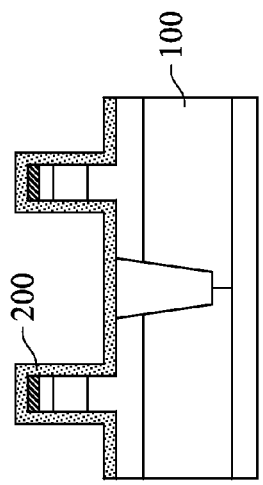

Referring to FIG. 29, the spacer layer 200 is patterned to expose the top surfaces of the N-type drain layer 122, the P-type drain layer 132, and the semiconductor wire structures 160. After the spacer layer 200 is patterned, a metal layer 202 is formed on the substrate 100. The metal layer 202 is made of, for example, Ti, Co, Ni, NiCo, Pt, NiPt, Er, or Yb. In some embodiments, a cap layer is optionally formed on the metal layer 202. The cap layer is, for example, a titanium nitride layer.

Figure 30:
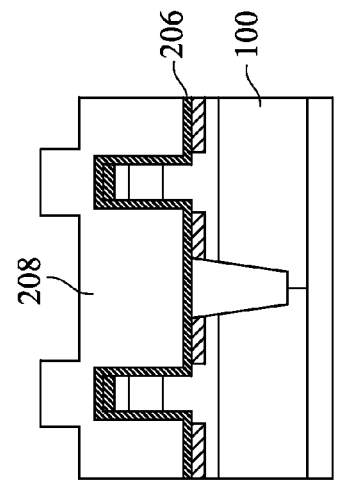
Figure 31:
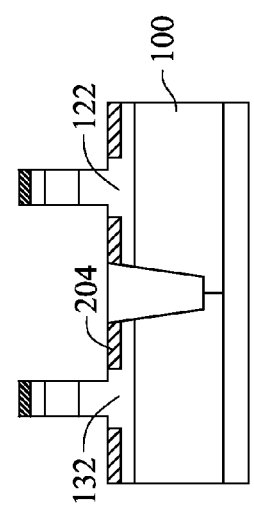

Referring to FIG. 30, the substrate 100 is annealed for silicidation. Portions of the N-type drain layer 122 and the P-type drain layer 132 in contact with the metal layer react with the metal layer and become bottom silicide regions 204 at the this process. The bottom silicide regions 204 are formed on the P-type drain layer 132 and the N-type drain layer 122. The unreacted portion of the metal layer is removed after the bottom silicide regions 204 are formed. The unacted portion of the metal layer is removed by, for example, a wet stripping process. The spacer layer 200 is removed after this step as shown in FIG. 31.

Figure 32:
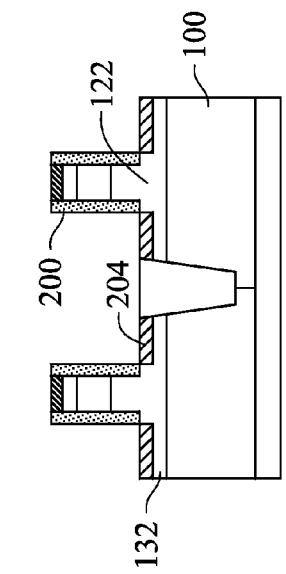

Referring to FIG. 32, an etch stop layer 206 is formed on the substrate 100, and an insulation layer 208 is formed on the etch stop layer 206. The etch stop layer 206 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide (SiO$_2$). The insulation layer 208 is made of a dielectric material or an insulating material, such as silicon oxide or silicon nitride.

Figure 33:
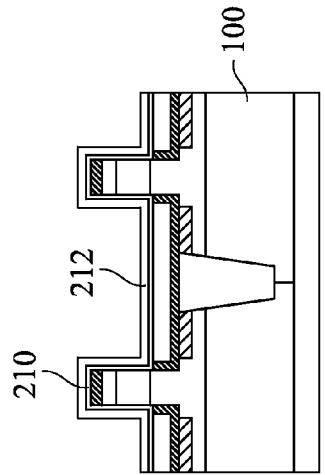

Referring to FIG. 33, the insulation layer 208 is polished by, for example, a CMP process. The process of polishing the insulation layer 208 is stopped on the etch stop layer 206.

Figure 34:
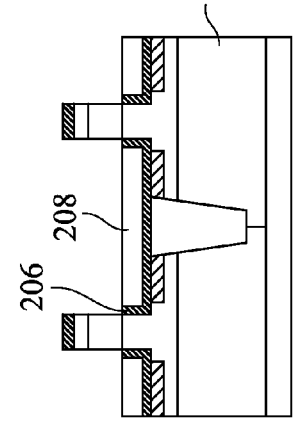

Referring to FIG. 34, portions of the etch stop layer 206 and the insulation layer 208 are removed. The etch stop layer 206 and the insulation layer 208 are removed by one or more dry etching processes. The portions of the etch stop layer 206 and the insulation layer 208 above the N-type drain layer 122 and the P-type drain layer 132 are removed. The remaining insulation layer 208 can be regarded as a bottom insulation layer.

Figure 35:
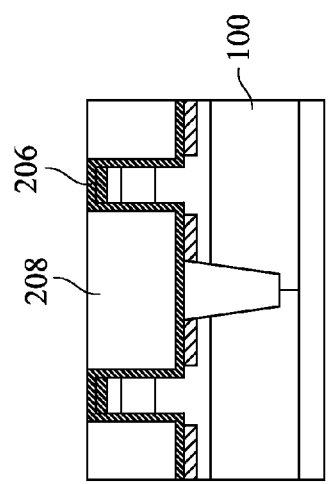

Referring to FIG. 35, a high-k (HK) dielectric layer 210 and a P-type work function layer 212 are formed on the substrate 100. An interfacial layer (IL) is optionally formed between the high-k dielectric layer 210 and the substrate 100. The interfacial layer is made of, for example, silicon oxide (SiO$_2$), HfSiO, SiON, or combinations thereof. In some embodiments, the interfacial layer includes a chemical SiO$_2$ layer with hydroxyl groups. With hydroxyl groups on the surface of the interfacial layer, the quality of subsequent growing high-k dielectric layer 210 is enhanced.

The high-k dielectric layer 210 is formed over the interfacial layer by atomic layer deposition (ALD), chemical vapor deposition (CVD), metal organic CVD (MOCVD), physical vapor deposition (PVD), thermal oxidation, or combinations thereof. The high-k dielectric layer 210 is, for example, a binary or ternary high-k film, such as HfOx. Alternatively, the high-k dielectric layer 210 is made of a high-k dielectric, such as LaO, AlO, ZrO, $ZrO_2$, TiO, $Ta_2O_5$, $Y_2O_3$, $SrTiO_3$ (STO), $BaTiO_3$ (BTO), BaZrO, HfZrO, $HfZrO_2$, HfLaO, HfSiO, LaSiO, $La_2O_3$, AlSiO, $TiO_2$, HfTaO, HfTiO, $HfO_2$, $(Ba,Sr)TiO_3$ (BST), $Al_2O_3$, $Si_3N_4$, oxynitrides, or combinations thereof.

The P-type work function layer 212 is made of, for example, TiN, W, Ta, Ni, Pt, Ru, Mo, Al, WN, or combinations thereof.

Figure 36:
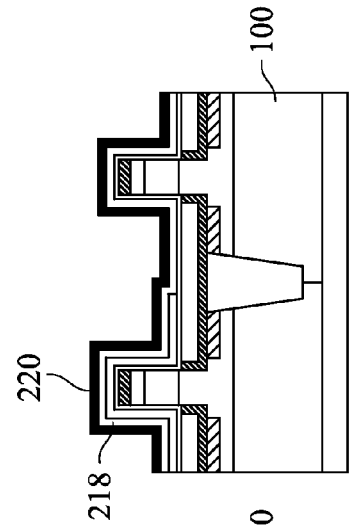

Referring to FIG. 36, a barrier and anti-reflective coating (BARC) layer 214 is coated over substrate 100. The BARC layer 214 is made of, for example, silicon oxynitride or an organic material. The BARC layer 214 is formed by a deposition process and then is polished. A mask layer 216 is formed on the BARC layer 214. The BARC layer 214 and the mask layer 216 are patterned. The semiconductor wire structure 160 disposed on the N-well 110 is protected by the BARC layer 214 and the mask layer 216, while portions of the BARC layer 214 and the mask layer 216 above the P-well 120 are removed. A portion of the P-type work function layer 212 above the P-well 120 is removed. After the portion of the P-type work function layer 212 is removed, the BARC layer 214 and the mask layer 216 are also removed.

Figure 37:

Referring to FIG. 37, an N-type work function layer 218 is formed on the substrate 100. The N-type work function layer 218 is made of, for example, Ti, Ag, Al, TiAlMo, Ta, TaN, TiAlC, TiAlN, TaC, TaCN, TaSiN, Mn, Zr, or combinations thereof.

Figure 38:
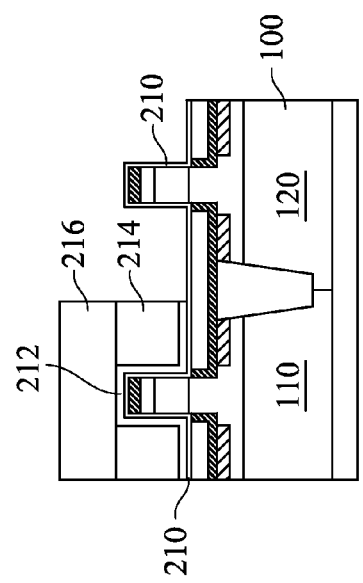

Referring to FIG. 38, a metal gate layer 220 is formed on the substrate 100. The metal gate layer 220 is deposited on the N-type work function layer 218 by ALD, PVD, CVD, or other processes. The metal gate layer 220 is made of, for example, Al, W, Co, or Cu.

Figure 39:
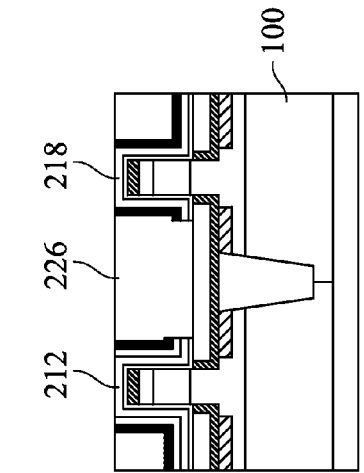

Referring to FIG. 39, portions of the metal gate layer 220, the N-type work function layer 218, the P-type work function layer 212, and the high-k dielectric layer 210 above the STI dielectric 148 are removed by, for example, a dry etching process. The dry etching process is stopped on the bottom insulation layer 208.

Figure 40:
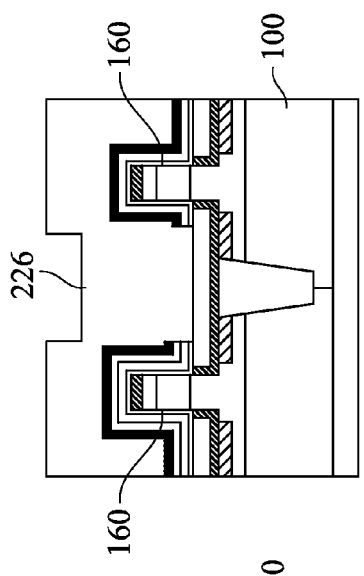

Referring to FIG. 40, an insulation layer 226 is formed on the substrate 100. The gaps between the semiconductor wire structures 160 are filled with the insulation layer 226.

Figure 41:
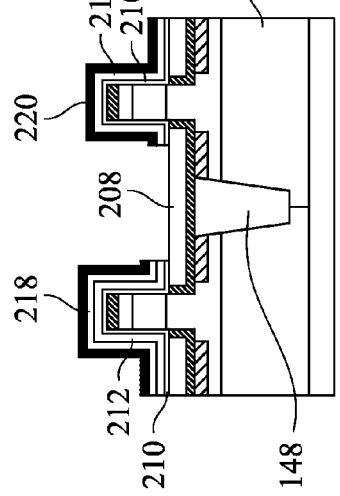

Referring to FIG. 41, the insulation layer 226 is polished, for example, by a CMP process. The insulation layer 226 is polished until it reaches the P-type work function layer 212 and the N-type work function layer 218.

Figure 42:
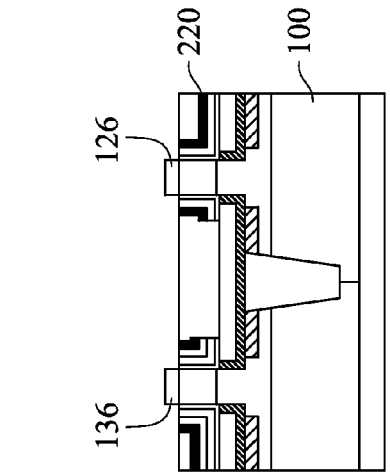

Referring to FIG. 42, the insulation layer 226 is etched by a dry etching or wet etching process. A portion of the insulation layer 226 above the STI dielectric 148 is removed. The remaining insulation layer 226 can be regarded as a middle insulation layer, which is disposed on the bottom insulation layer 208. The middle insulation layer 226 and the bottom insulation layer 208 are made of the same dielectric material. The top surface of the middle insulation layer 226 is substantially level with the top surface of the N-type channel layer 124 and the P-type channel layer 134. The middle insulation layer 226 and the bottom insulation layer 208 are regarded as an insulation layer 230 hereafter.

Figure 43:
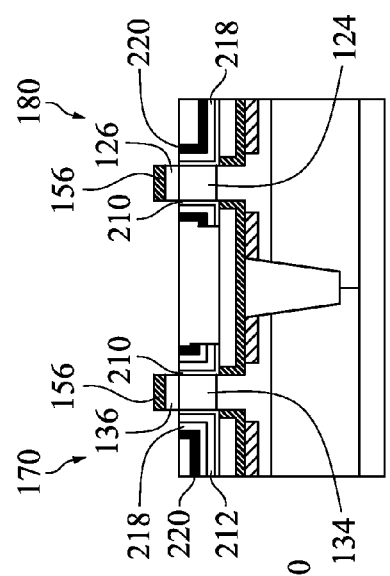

Referring to FIG. 43, top portions of the metal gate layer 220, the N-type work function layer 218, the P-type work function layer 212, and the high-k dielectric layer 210 are removed by a dry etching or wet etching process to expose the P-type source layer 126, the N-type source layer 136, and the second hard mask layer 156 thereon. The metal gate layer 220 is disposed around the N-type channel layer 124 and the P-type channel layer 134, and the high-k dielectric layer 210 is disposed between the metal gate layer 220 and the N-type channel layer 124 and the P-type channel layer 134. After this step, an N-type tunnel field-effect transistor 180 and a P-type tunnel field-effect transistor 170 with vertical gate all around (VGAA) structures are formed.

Figure 44:
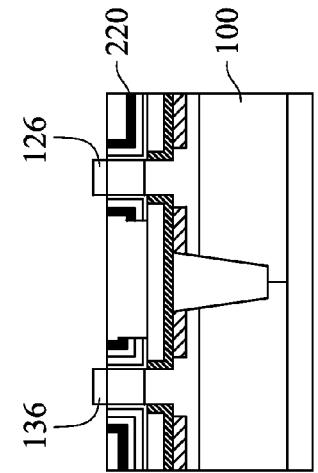

Referring to FIG. 44, the second hard mask layer 156 shown in FIG. 43 is removed, so as the expose the P-type source layer 126, the N-type source layer 136.

Figure 45:
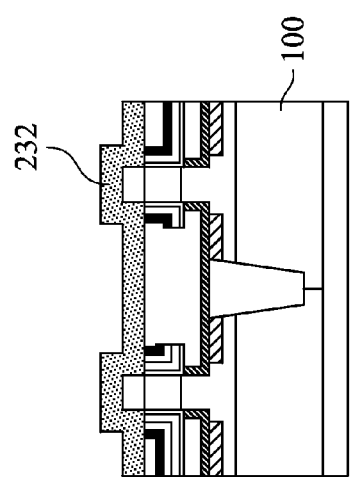

Referring to FIG. 45, a dielectric hard mask layer 232 is formed on the substrate 100. The dielectric hard mask layer 232 can be made of a dielectric material, such as silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$). The dielectric hard mask layer 232 is utilized for a later self-aligned contact process.

Figure 46:
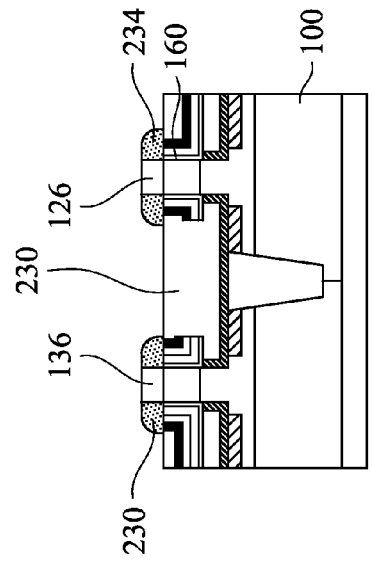

Referring to FIG. 46, the dielectric hard mask layer is etched by an anisotropic etch, and a plurality of sidewall spacers 234 are formed at the sidewall of the semiconductor wire structures 160. The sidewall spacers 234 and the insulation layer 230 are made of different materials. The sidewall spacers 234 are disposed around the P-type source layer 126 and the N-type source layer 136.

Figure 47:
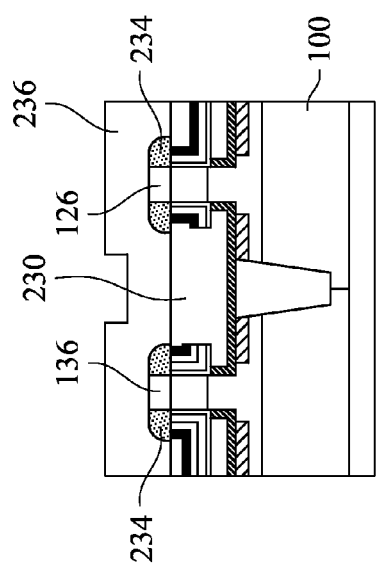

Referring to FIG. 47, an insulation layer 236 is formed on the substrate 100 and covers the insulation layer 230 and the sidewall spacers 234. Thus, the gaps between the P-type source layer 126 and the N-type source layer 136 are filled with the insulation layer 236. The sidewall spacers 234 and the insulation layer 236 are made of different materials.

Figure 48:
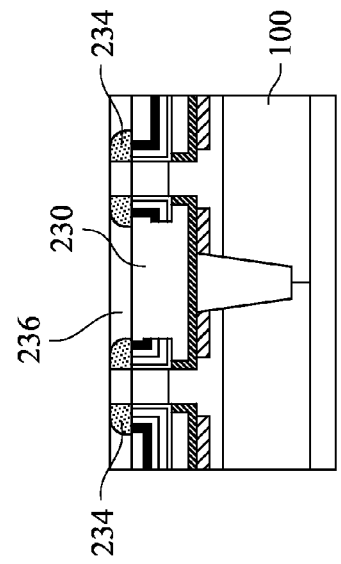

Referring to FIG. 48, the insulation layer 236 is polished. The polish process is stop at the sidewall spacers 234. The sidewall spacers 234 are surrounded by the insulation layer 236. The remaining insulation layer 236 is regarded as a part of the insulation layer 230 hereafter.

Figure 49:
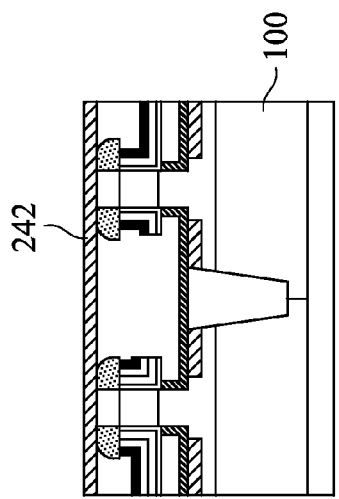

Referring to FIG. 49, a silicon-contained layer 238 is formed on the substrate 100. The silicon-contained layer 238 can be an amorphous silicon or poly-silicon layer.

Figure 50:
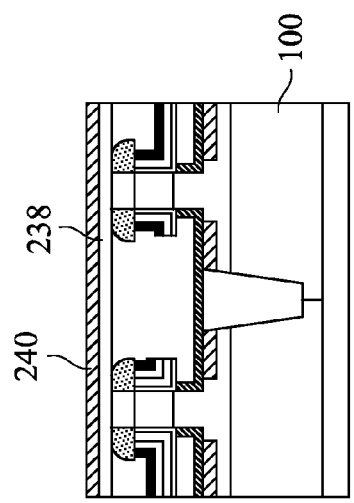

Referring to FIG. 50, a metal layer 240 is formed on the silicon-contained layer 238. The metal layer 240 is made of, for example, Ti, Co, Ni, NiCo, Pt, NiPt, Er, or Yb. In some embodiments, a cap layer is optionally formed on the metal layer 240. The cap layer is made of, for example, titanium nitride.

Figure 51:
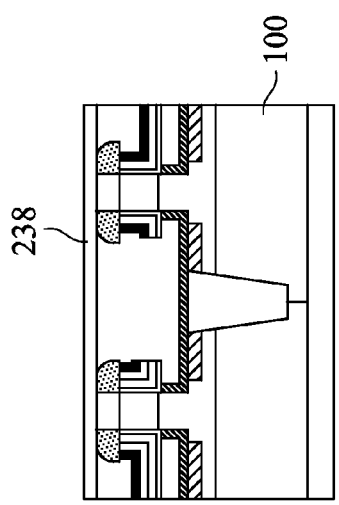

Referring to FIG. 51, the substrate 100 is annealed for silicidation. The silicon-contained layer is in contact with the metal layer and reacts with the metal layer to become a top silicide layer 242 at this process. The remaining metal layer can be removed by, for example, a wet stripping process.

Figure 52:
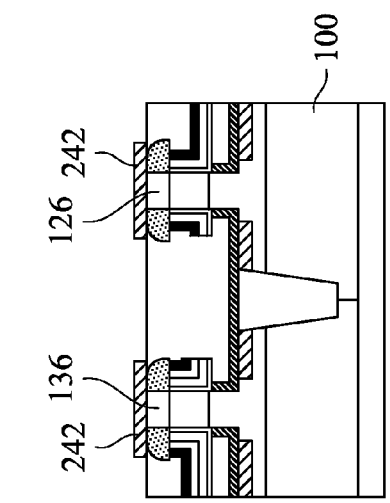

Referring to FIG. 52, a mask layer 244 is formed on the top silicide layer 242, and the mask layer 244 is patterned to form a plurality features and openings defined by the features. The P-type tunnel field-effect transistor 170 and the N-type tunnel field-effect transistor 180 are covered by the mask layer 244, and the portion of the top silicide layer 242 exposed by the mask layer 244 is removed. The mask layer 244 is removed after this step.

Figure 53:
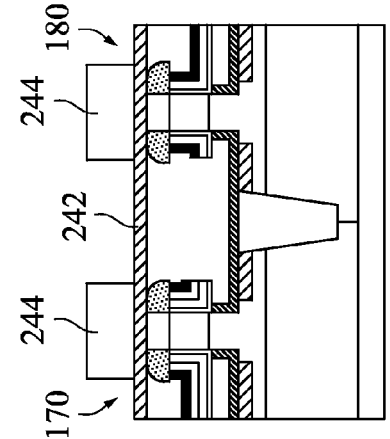

Referring to FIG. 53, the patterned top silicide layer 242 is formed on the P-type source layer 126 and the N-type source layer 136 as a plurality of top silicide regions.

Referring to FIG. 54, an insulation layer 246 is formed on the substrate 100 and is polished. The top surface of the insulation layer 246 is higher than the top surface of the N-type tunnel field-effect transistor 180 and the P-type tunnel field-effect transistor 170. The remaining insulation layer 246 and the insulation layer 230 are called insulation layer 248 hereafter. The N-type tunnel field-effect transistor 180 and the P-type tunnel field-effect transistor 170 are isolated by the insulation layer 248.

Referring to FIG. 55, the insulation layer 248 is patterned, and a plurality of openings 250 are formed in the insulation layer 248. The openings 250 respectively expose the metal gate layer 220, the bottom silicide regions 204, and the top silicide layer 242. The openings 250 can be formed by a dry etching process, in which the insulation layer 248 is etched at a greater rate than the sidewall spacers 234, such the P-type source layer 126 and the N-type source layer 136 are protected during the etching process. Because of the sidewall spacers 234, the openings 250 lead to the bottom silicide regions 204 and the metal gate layer 220 have at least two different sizes. The size of the openings 250 above the sidewall spacers 234 is larger than that under the sidewall spacers 234.

Referring to FIG. 56, a conductive material 252 is deposited, and the openings 250 are filled with the conductive material 252. The conductive material 252, for example, can be formed by a W, Co, Al, or Cu deposition. Then, the conductive material 252 is polished by, for example, a CMP process.

Referring to FIG. 57, a plurality of contact structures 254 are formed in the openings 250. The contact structures 254 are respectively connected to metal gate layer 220, the bottom silicide regions 204, and the top silicide layer 242. The contact structures 254 are respectively connected to the N-type drain layer 122 and the P-type drain layer 132 via the bottom silicide regions 204. The contact structures 254 are respectively connected to the P-type source layer 126 and the N-type source layer 136 via the top silicide layer 242. Because the openings 250 have different sizes, the corresponding contact structures 254 also have different sizes above and under the sidewall spacers 234. For example, the contact structure 254 connected to the metal gate layer 220 is regarded as a gate contact, and the cross-sectional area of the gate contact above the sidewall spacer 234 is larger than that under the sidewall spacer 234. This process is also called self-aligned contact (SAC). The sidewall spacers 234 can prevent electrical shorts between the contact structures 254. In some embodiments, the sidewall spacers 234 can be omitted, and the openings 250 and the contact structures 254 have uniform diameter.

Referring to FIG. 58, a plurality of electrodes 256 are respectively formed on the contact structures 254 for later interconnection, such as a back end of line (BEOL) process. The electrodes 256 include gate electrodes, source electrodes, and drain electrodes. The electrodes 256 can be Cu, Co, or other metal.

As described above, the tunnel field-effect transistor component including one or more tunnel field-effect transistors is provided. The tunnel field-effect transistor includes a high-k metal gate structure and thus has immunity to the short channel effect. The tunnel field-effect transistors may have opposite conductive types. Furthermore, by using the self-aligned contact process, the electric shorts between the contact structures can be prevented.

According to various aspects of the present disclosure, the tunnel field-effect transistor includes a drain layer, a source layer, a channel layer, a metal gate layer, and a high-k dielectric layer. The drain and source layers are of opposite conductive types. The channel layer is disposed between the drain layer and the source layer. At least one of the drain layer, the channel layer, and the source layer has a substantially constant doping concentration. The metal gate layer is disposed around the channel layer. The high-k dielectric layer is disposed between the metal gate layer and the channel layer.

In some embodiments, the drain layer, the source layer, and the channel layer are substantially vertically stacked. The doping concentration of the source layer is greater than a doping concentration of the drain layer.

In some embodiments, the tunnel field-effect transistor includes a sidewall spacer disposed around the source layer, an insulation layer disposed at least around the sidewall spacer, and a gate contact. The insulation layer and the sidewall spacer are made of different materials, and the insulation layer has at least one opening therein to expose the metal gate layer. The gate contact is connected to the metal gate layer through the opening, wherein the sidewall spacer is disposed between the gate contact and the source layer. In some embodiments, the cross-sectional area of the gate contact above the sidewall spacer is larger than that under the sidewall spacer. In some embodiments, the tunnel field-effect transistor includes a drain contact connected to the drain layer. The sidewall spacer is disposed between the drain contact and the source layer, and the cross-sectional area of the drain contact above the sidewall spacer is larger than that under the sidewall spacer.

According to various aspects of the present disclosure, the tunnel field-effect transistor component includes a substrate, a first-type tunnel field-effect transistor, and a second-type tunnel field-effect transistor. The substrate has a first-type well, a second-type well, and a shallow trench isolation feature separating the first-type well and the second-type well. The first-type tunnel field-effect transistor is disposed on the second-type well. The first-type tunnel field-effect transistor includes a first-type drain layer, a second-type source layer, a first-type channel layer disposed between the first-type drain layer and the second-type source layer, a first metal gate layer disposed around the first-type channel layer, and a first high-k dielectric layer disposed between the first metal gate layer and the first-type channel layer. At least one of the first-type drain layer, the first-type channel layer, and the second-type source layer has a substantially constant doping concentration. The second-type tunnel field-effect transistor is disposed on the first-type well. The second-type tunnel field-effect transistor includes a second-type drain layer, a first-type source layer, a second-type channel layer disposed between the second-type drain layer and the first-type source layer, a second metal gate layer disposed around the second-type channel layer, and a second high-k dielectric layer disposed between the second metal gate layer and the second-type channel layer. At least one of the second-type drain layer, the second-type channel layer, and the first-type source layer has a substantially constant doping concentration.

In some embodiments, the first-type drain layer, the second-type source layer, and the first-type channel layer are substantially vertically stacked. The second-type drain layer, the first-type source layer, and the second-type channel layer are substantially vertically stacked.

In some embodiments, the doping concentration of the first-type source layer is larger than the doping concentration of the second-type drain layer. The doping concentration of the second-type source layer is larger than the doping concentration of the first-type drain layer.

In some embodiments, the tunnel field-effect transistor component includes a silicide region formed on the first source layer and the second source layer, and a plurality of sidewall spacers respectively disposed around the first and second source layers, and disposed between the silicide region and the metal gate layer.

According to various aspects of the present disclosure, a method for fabricating a tunnel field-effect transistor includes providing a substrate, forming a semiconductor wire structure on the substrate, forming a high-k dielectric layer around the semiconductor wire structure; and forming a metal gate layer around the high-k dielectric layer. The semiconductor wire structure includes a bottom source or drain layer formed on the substrate, a channel layer formed on the bottom source or drain layer, and a top source or drain layer formed on the channel layer, in which at least one of the bottom source or drain layer, the channel layer, and top source or drain layer has a substantially constant doping concentration.

In some embodiments, the method further includes forming a bottom silicide region on the bottom source or drain layer, and forming a top silicide region on the top source or drain layer.

In some embodiments, the method further includes forming a sidewall spacer around the top source or drain layer, forming an insulation layer over the substrate and at least around the sidewall spacer, forming at least one opening in the insulation layer, and filling the opening with a conductive material. The insulation layer and the sidewall spacer are made of different materials. The opening exposes the metal gate layer in an etching process that etches the insulation layer at a greater rate than the sidewall spacer such that the top source or drain layer is protected during the etch process. The opening exposes the bottom source or drain layer in an etching process that etches the insulation layer at a greater rate than the sidewall spacer such that the top source or drain layer is protected during the etch process. The insulation layer and the sidewall spacer are made of different materials. The cross-sectional area of the opening above the sidewall spacer is larger than that under the sidewall spacer.

In some embodiments, The step of forming the semiconductor wire structure includes forming a plurality of epitaxial layers on the substrate, and etching the epitaxial layers to form the semiconductor wire structure having the bottom source or drain layer, the channel layer, and the top source or drain layer. The method further includes forming a well region on the substrate with an implantation process, in which the semiconductor wire structure is formed on the well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tunnel field-effect transistor comprising:
    a drain layer;
    a source layer, wherein the drain and source layers are of opposite conductive types;
    a channel layer disposed between the drain layer and the source layer, wherein the drain layer has a substantially constant doping concentration;
    a metal gate layer disposed around the channel layer;
    a high-k dielectric layer disposed between the metal gate layer and the channel layer;
    a sidewall spacer disposed around the source layer;
    a drain contact connected to the drain layer and having a portion in contact with the sidewall spacer;
    a gate contact connected to the metal gate layer and having a portion in contact with the sidewall spacer; and
    an insulation layer around the sidewall spacer and the gate contact, wherein a portion of the insulation layer is disposed under the sidewall spacer and is between the gate contact and the metal gate layer.

2. The tunnel field-effect transistor of claim 1, wherein the drain layer, the source layer, and the channel layer are substantially vertically stacked.

3. The tunnel field-effect transistor of claim 1, wherein a doping concentration of the source layer is greater than a doping concentration of the drain layer.

4. The tunnel field-effect transistor of claim 1, wherein the insulation layer and the sidewall spacer are made of different materials.

5. The tunnel field-effect transistor of claim 1, wherein a cross-sectional area of the gate contact above the sidewall spacer is larger than that under the sidewall spacer.

6. The tunnel field-effect transistor of claim 1,
    wherein the sidewall spacer is disposed between the drain contact and the source layer, and a cross-sectional area of the drain contact above the sidewall spacer is larger than that under the sidewall spacer.

7. The tunnel field-effect transistor of claim 1, further comprising a work function metal layer disposed between the high-k dielectric layer and the metal gate layer.

8. The tunnel field-effect transistor of claim 1, further comprising a silicide region formed on the source layer.

9. The tunnel field-effect transistor of claim 8, further comprising a contact structure connected to the silicide region.

10. The tunnel field-effect transistor of claim 1, further comprising a silicide region formed on the drain layer.

11. The tunnel field-effect transistor of claim 10, further comprising a contact structure connected to the silicide region.

12. A tunnel field-effect transistor component comprising:
    a substrate having a first conductive type well, a second conductive type well, and a shallow trench isolation feature separating the first conductive type well and the second conductive type well;
    a first conductive type tunnel field-effect transistor disposed on the second conductive type well, the first conductive type tunnel field-effect transistor comprising:
        a first conductive type drain layer;
        a second conductive type source layer;
        a first conductive type channel layer disposed between the first conductive type drain layer and the second conductive type source layer, wherein the first conductive type drain layer is an epitaxial layer;
        a first metal gate layer disposed around the first conductive type channel layer;
        a sidewall spacer disposed around the second conductive type source layer;
        a drain contact connected to the first conductive type drain layer and having a portion in contact with the sidewall spacer;
        a gate contact connected to the first metal gate layer and having a portion in contact with the sidewall spacer;

a first high-k dielectric layer disposed between the first metal gate layer and the first conductive type channel layer; and an insulation layer around the sidewall spacer and the gate contact, wherein a portion of the insulation layer is disposed under the sidewall spacer and is between the gate contact and the first metal gate layer; and a second conductive type tunnel field-effect transistor disposed on the first conductive type well, the second conductive type tunnel field-effect transistor comprising:

a second conductive type drain layer;

a first conductive type source layer;

a second conductive type channel layer disposed between the second conductive type drain layer and the first conductive type source layer, wherein the second conductive type drain layer is an epitaxial layer;

a second metal gate layer disposed around the second conductive type channel layer; and a second high-k dielectric layer disposed between the second metal gate layer and the second conductive type channel layer.

13. The tunnel field-effect transistor component of claim 12, wherein the first conductive type drain layer, the second conductive type source layer, and the first conductive type channel layer are substantially vertically stacked.

14. The tunnel field-effect transistor component of claim 12, wherein the second conductive type drain layer, the first conductive type source layer, and the second conductive type channel layer are substantially vertically stacked.

15. The tunnel field-effect transistor component of claim 12, wherein a doping concentration of the first conductive type source layer is greater than a doping concentration of the second conductive type drain layer.

16. The tunnel field-effect transistor component of claim 12, wherein a doping concentration of the second conductive type source layer is greater than a doping concentration of the first conductive type drain layer.

17. The tunnel field-effect transistor component of claim 12, further comprising:

a first conductive type work function metal layer disposed between the first high-k dielectric layer and the first metal gate layer; and a second conductive type work function metal layer disposed between the second high-k dielectric layer and the second metal gate layer.

18. The tunnel field-effect transistor component of claim 12, wherein the first conductive type drain layer is disposed between the second conductive type well and the first conductive type channel layer, and the second conductive type drain layer is disposed between the first conductive type well and the second conductive type channel layer.

19. A tunnel field-effect transistor comprising:

a semiconductor wire structure formed on a substrate, the semiconductor wire structure comprising a drain layer, a source layer, and a channel layer between the drain layer and the source layer;

a metal gate layer disposed around the channel layer;

a high-k dielectric layer disposed between the metal gate layer and the channel layer;

a sidewall spacer disposed around the source layer;

a drain contact connected to the drain layer and having a portion in contact with the sidewall spacer;

a gate contact connected to the metal gate layer and having a portion in contact with the sidewall spacer; and an insulation layer around the sidewall spacer and the gate contact, wherein a portion of the insulation layer is disposed under the sidewall spacer and is between the gate contact and the metal gate layer.

20. The tunnel field-effect transistor of claim 19, wherein a cross-sectional area of the drain contact above the sidewall spacer is larger than that under the sidewall spacer.

* * * * *